(12) United States Patent
Lo et al.

(10) Patent No.: US 10,146,272 B1
(45) Date of Patent: Dec. 4, 2018

(54) EXTERNALLY MOUNTED INTERNAL COMPONENT RETENTION SYSTEM

(71) Applicant: Dell Products L.P., Round Rock, TX (US)

(72) Inventors: Michael Lo, Round Rock, TX (US); Raymond DeWine Heistand, II, Round Rock, TX (US); Harold J. Syring, Temple, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/961,665

(22) Filed: Apr. 24, 2018

(51) Int. Cl.
    *G06F 1/18*     (2006.01)
    *H05K 7/14*     (2006.01)

(52) U.S. Cl.
    CPC .............. *G06F 1/186* (2013.01); *G06F 1/182* (2013.01); *H05K 7/1487* (2013.01)

(58) Field of Classification Search
None
See application file for complete search history.

(56) References Cited

U.S. PATENT DOCUMENTS

| | | | |
|---|---|---|---|
| 6,693,800 B1* | 2/2004 | Lin .......................... | G06F 1/184 211/41.17 |
| 6,704,205 B1* | 3/2004 | Chen ....................... | G06F 1/184 211/41.17 |
| 7,753,458 B2* | 7/2010 | Liang ..................... | H05K 7/1408 312/223.2 |
| 8,408,661 B2* | 4/2013 | Chen ....................... | G06F 1/186 312/223.2 |
| 8,446,720 B2* | 5/2013 | Li .......................... | H05K 7/1408 312/223.1 |
| 9,137,922 B2* | 9/2015 | Lin ....................... | H05K 7/1487 |
| 2001/0053060 A1* | 12/2001 | Gan ..................... | H05K 9/0016 361/679.58 |
| 2002/0182896 A1* | 12/2002 | Welsh .................. | H05K 7/1409 439/1 |
| 2007/0153492 A1* | 7/2007 | Chen ....................... | G06F 1/186 361/801 |
| 2007/0177267 A1* | 8/2007 | Chen ....................... | G06F 1/185 359/514 |
| 2008/0000850 A1* | 1/2008 | Peng ..................... | H05K 7/1405 211/41.17 |
| 2008/0212295 A1* | 9/2008 | Xiao ....................... | G06F 1/186 361/759 |
| 2010/0002378 A1* | 1/2010 | Chen ....................... | G06F 1/186 361/679.58 |

(Continued)

*Primary Examiner* — Xanthia C Cunningham
(74) *Attorney, Agent, or Firm* — Haynes and Boone, LLP

(57) ABSTRACT

An externally mounted internal component retention device includes a base. A first chassis securing member extends from the base. The first chassis securing member is configured to engage a chassis to resist movement of the base relative to the chassis when the base is positioned immediately adjacent to an external mount surface on the chassis. A first internal component engagement member also extends from the base. The first internal component engagement member is configured to extend through an engagement member chassis aperture defined by the chassis and engage an internal component that is housed in the chassis to resist movement of the internal component relative to the chassis when the base is positioned immediately adjacent the external mount surface on the chassis.

20 Claims, 19 Drawing Sheets

(56) References Cited

U.S. PATENT DOCUMENTS

| | | | | |
|---|---|---|---|---|
| 2011/0110051 A1* | 5/2011 | Chen | ........................ | G06F 1/186 |
| | | | | 361/748 |
| 2011/0285259 A1* | 11/2011 | Chen | ........................ | G06F 1/186 |
| | | | | 312/223.2 |
| 2011/0310576 A1* | 12/2011 | Chen | ........................ | G06F 1/185 |
| | | | | 361/759 |

* cited by examiner

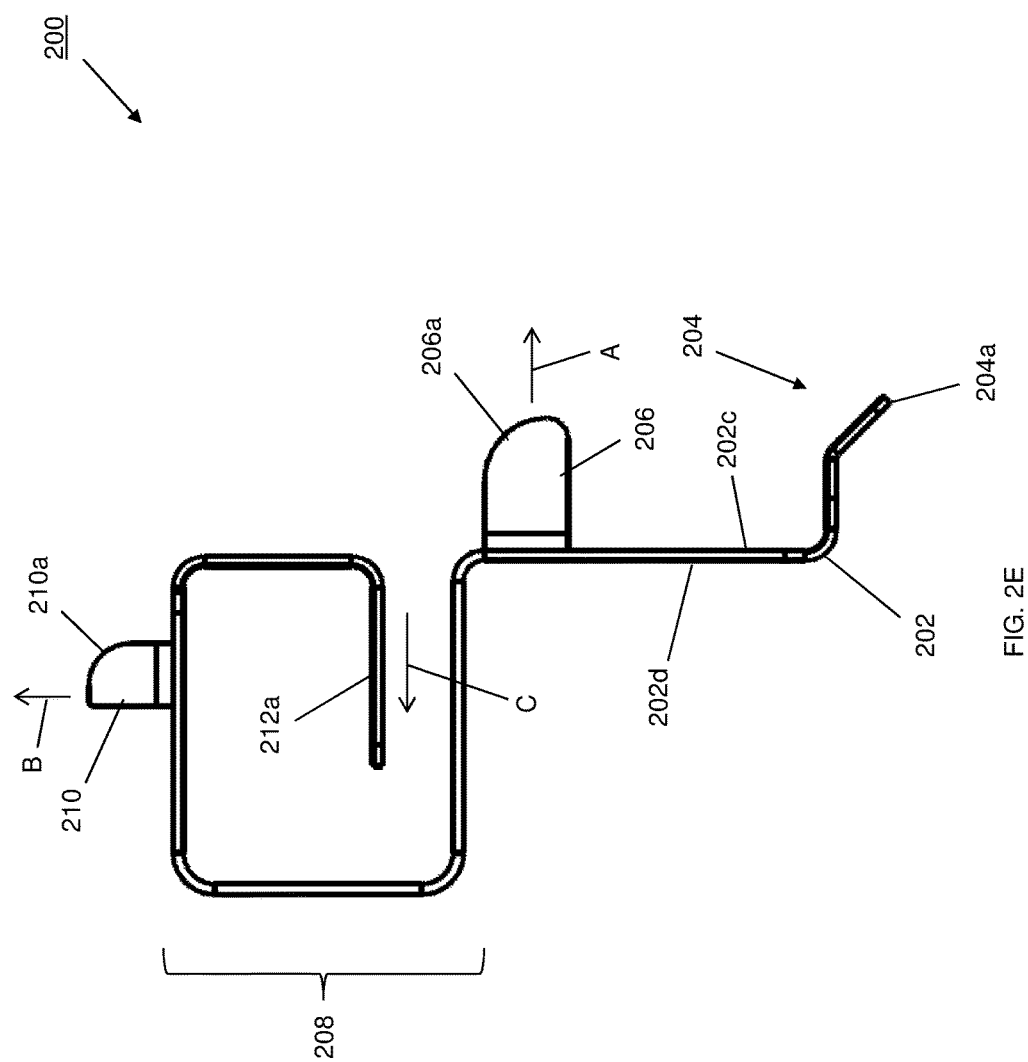

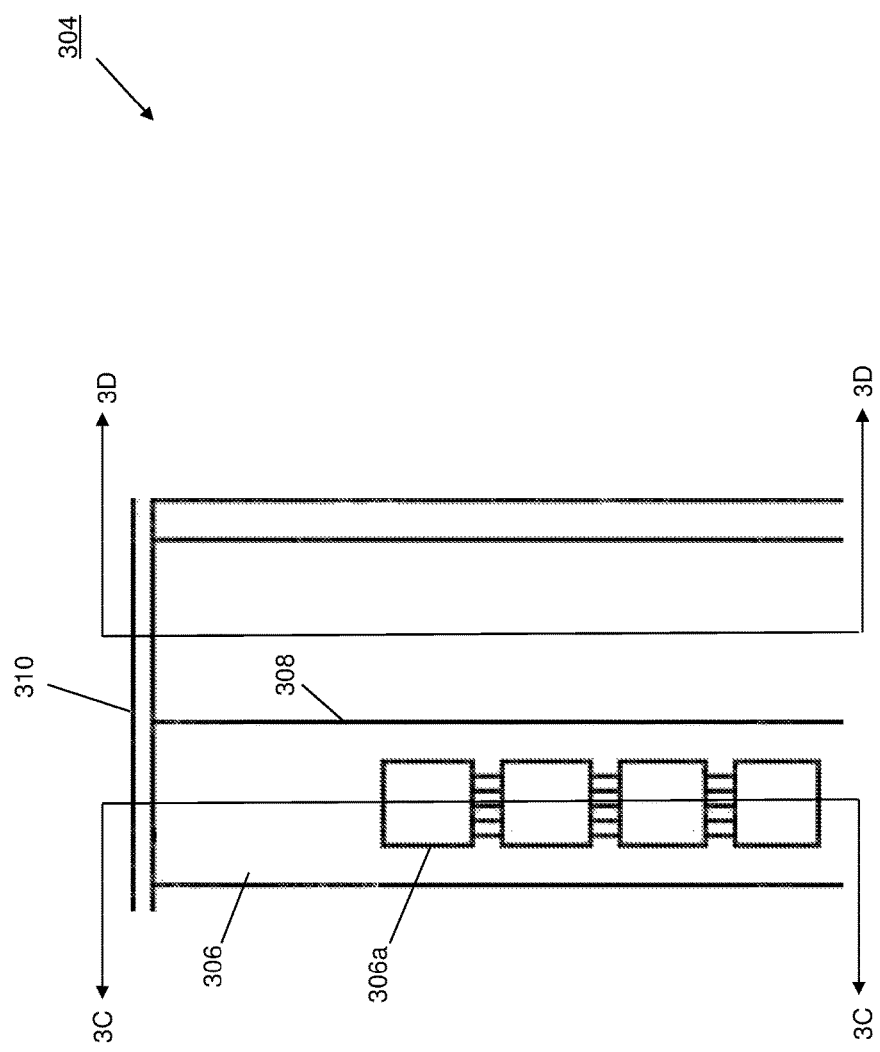

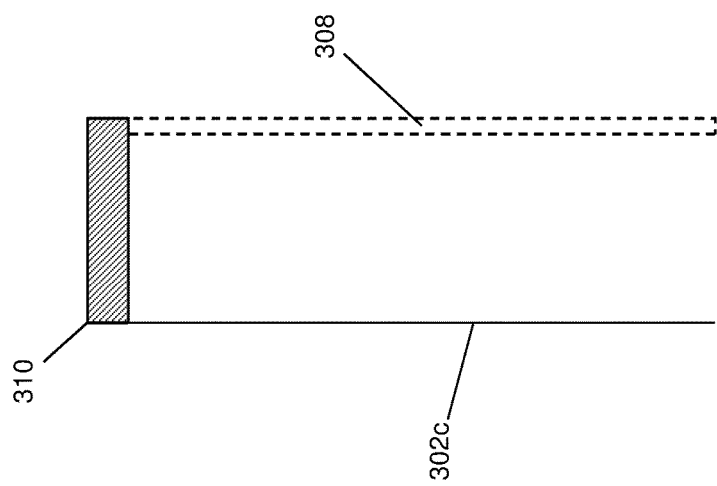

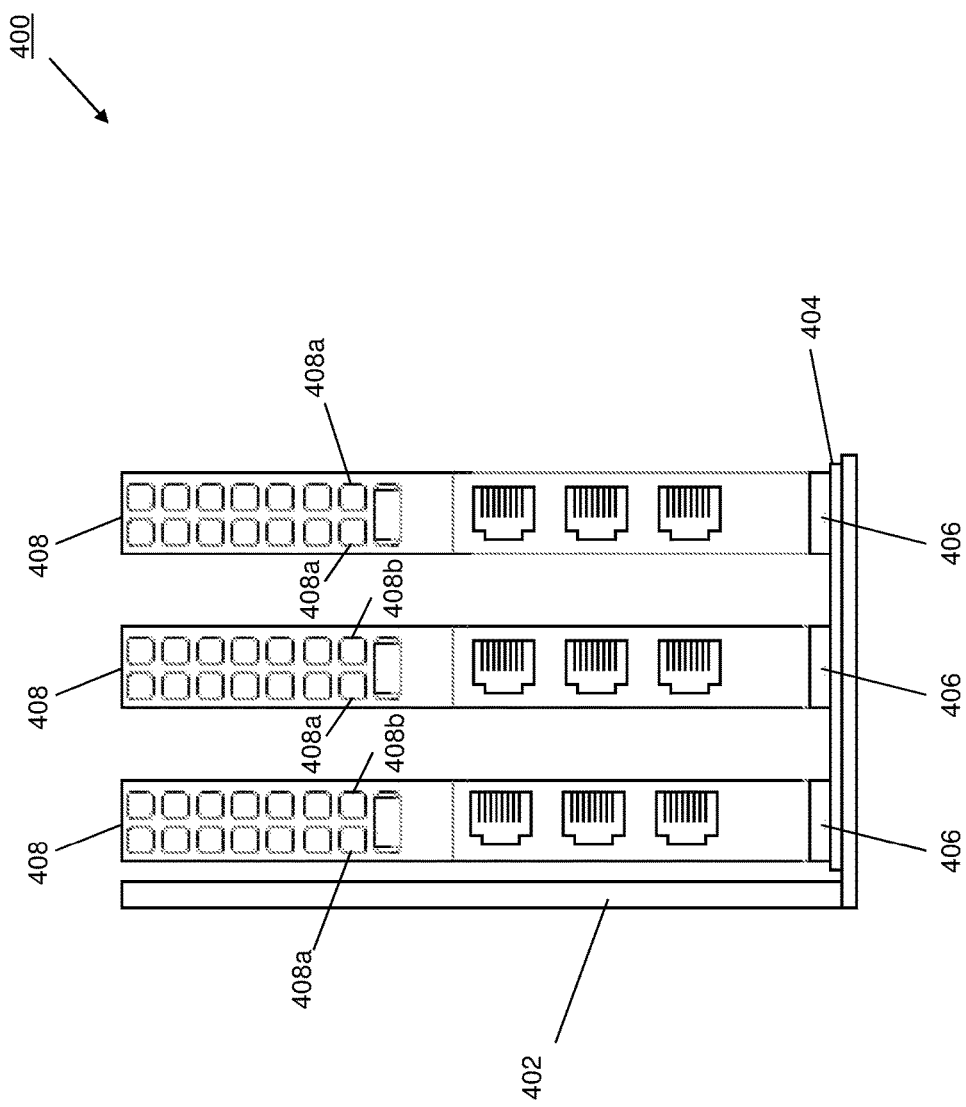

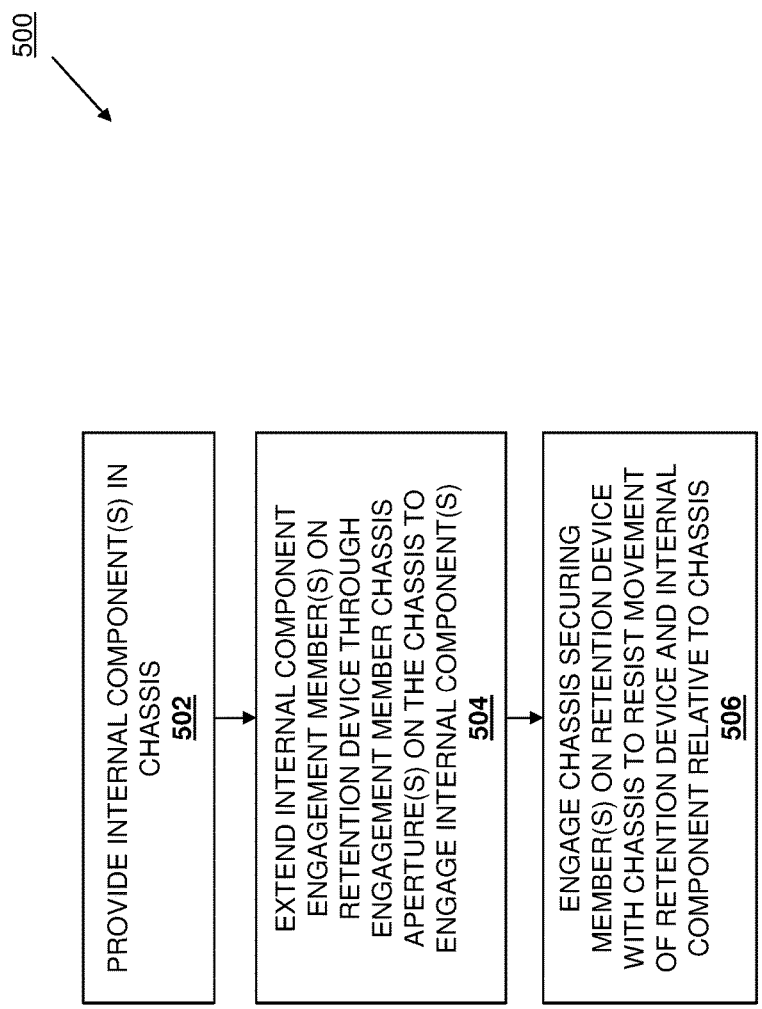

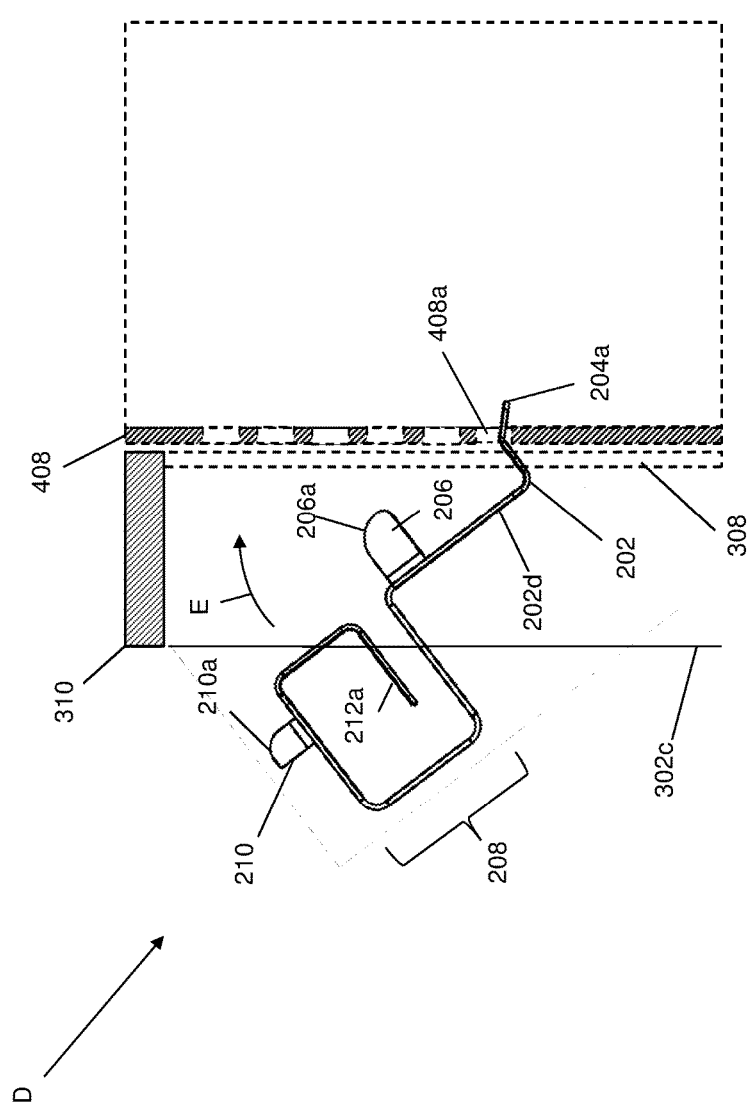

EXTERNALLY MOUNTED INTERNAL COMPONENT RETENTION SYSTEM

BACKGROUND

The present disclosure relates generally to information handling systems, and more particularly to retaining internal components in an information handling system using an externally mounted retention device.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often include a chassis that houses internal components of the information handling system. For example, server computing devices, desktop computing devices, and/or other computing devices may include cards such as Peripheral Component Interconnect (PCI) cards that are internally housed in the chassis of the computing devices, and those PCI cards may be connected to a connector located on a motherboard or other circuit board or subsystem that is housed in the chassis. Retention devices for internal components such as PCI cards are often included in a chassis in consideration of expected shock and vibration events, as even relatively small movements of the PCI card relative to its connector can cause the PCI card to become disconnected from that connector and lose the ability to communicate through the circuit board. Conventionally, retention devices are provided on the circuit board or housed within the chassis (e.g., extending from the circuit board, an internal wall of the chassis, or from another internal component in the chassis), with those retention devices operating to engage the PCI card to provide a force directed toward the connector that resists movement of the PCI card away from the connector. However, some computing devices include relatively dense chassis that limit or prevent the provisioning of the retention device internal to the chassis, and even in situations where retention devices may be provided internal to the chassis, those retention devices may provide an insufficient retention force that allows the PCI card to move relative to its connector such that they become disconnected.

Accordingly, it would be desirable to provide an improved internal component retention system.

SUMMARY

According to one embodiment, an Information Handling System (IHS) includes a chassis defining a chassis housing and an engagement member chassis aperture that extends through the chassis to the chassis housing, wherein the chassis includes an external mount surface that is located opposite the chassis from the chassis housing; an internal component located in the chassis housing adjacent the engagement member chassis aperture; and a retention device located immediately adjacent the external mount surface of the chassis, wherein the retention device includes: a first chassis securing member that engages the chassis to resist movement of the retention device relative to the chassis; and a first internal component engagement member extending through the engagement member chassis aperture and engaging the internal component to resist movement of the internal component relative to the chassis.

BRIEF DESCRIPTION OF THE DRAWINGS

FIG. 2E is a side view illustrating an embodiment of the external mount retention device of FIG. 2A.

FIG. 3B is a front view illustrating an embodiment of external mount coupling features on the chassis of FIG. 3A.

FIG. 3D is a cross sectional view illustrating an embodiment of an external mount coupling feature of FIG. 3B.

FIG. 4 is a front view illustrating an embodiment of internal components.

FIG. 5 is a flow chart illustrating an embodiment of a method for retaining internal components in a chassis.

FIG. 7A is a partial cross sectional view illustrating an embodiment of the external mount retention device of FIGS. 2A-2F being coupled to the chassis and internal components of FIG. 6.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
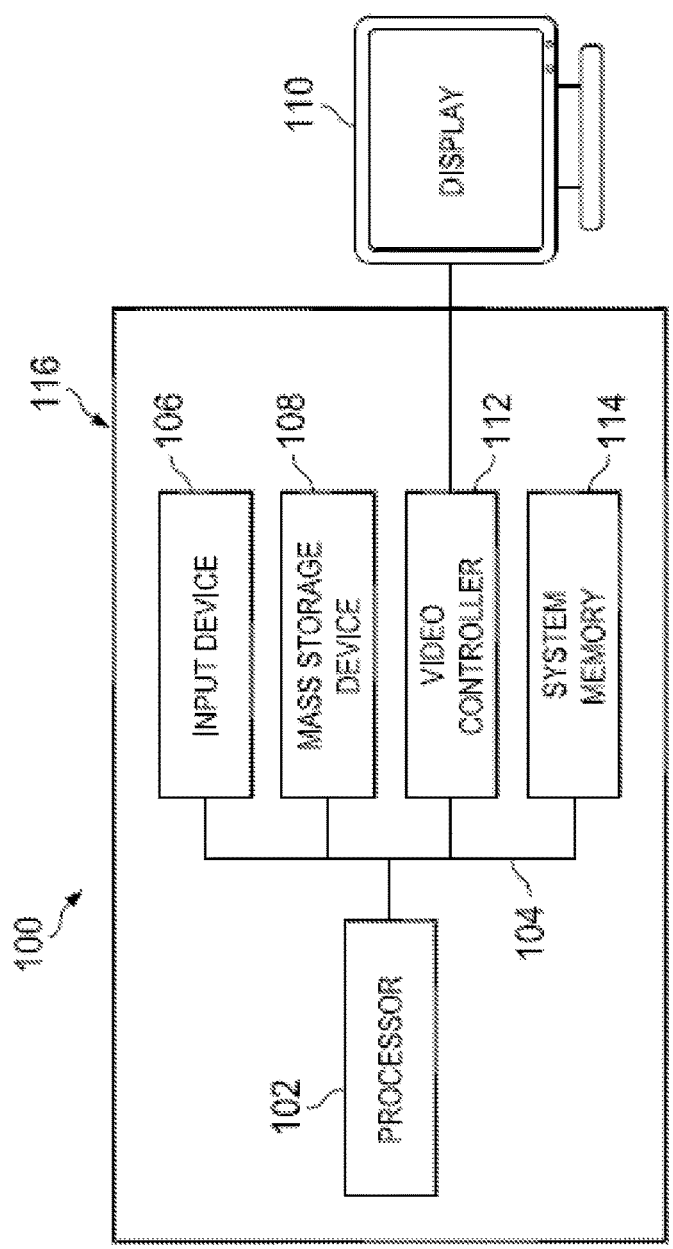
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mice, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIGS. 2A, 2B, 2C, 2D, 2E, and 2F, an embodiment of a retention device 200 is illustrated that, as discussed below, is configured to be externally mounted to a chassis to retain an internal component that is housed in that chassis. In the illustrated embodiment, the retention device 200 includes a base 202 having a top edge 202a, a bottom edge 202b that is located opposite the base 202 from the top edge 202a, a front surface 202c that extends between the top edge 202a and the bottom edge 202b, and a rear surface 202d that extends between the top edge 202a and the bottom edge 202b and that is located opposite the base 202 from the front surface 202c. The base 202 may be provided using a metal material (e.g., a sheet metal material), a plastic material, and/or a variety of other materials that would be apparent to one of skill in the art in possession of the present disclosure. A plurality of internal component engagement members 204 extend from the bottom edge 202b of the base 202 in a spaced apart orientation from each other, with each internal component engagement member 204 including a pair of spaced apart legs 204a and 204b. While the example of FIGS. 2A-2F includes a plurality of internal component engagement members, each with a multi-leg configuration, one of skill in the art will recognize that a single internal component engagement member or a different number of internal component engagement members, as well as different configurations of the internal component engagement member(s) (e.g., single leg, more than two legs, etc.), may be utilized depending on the application of the retention device 200 while remaining within the scope of the present disclosure.

Figure 2A:
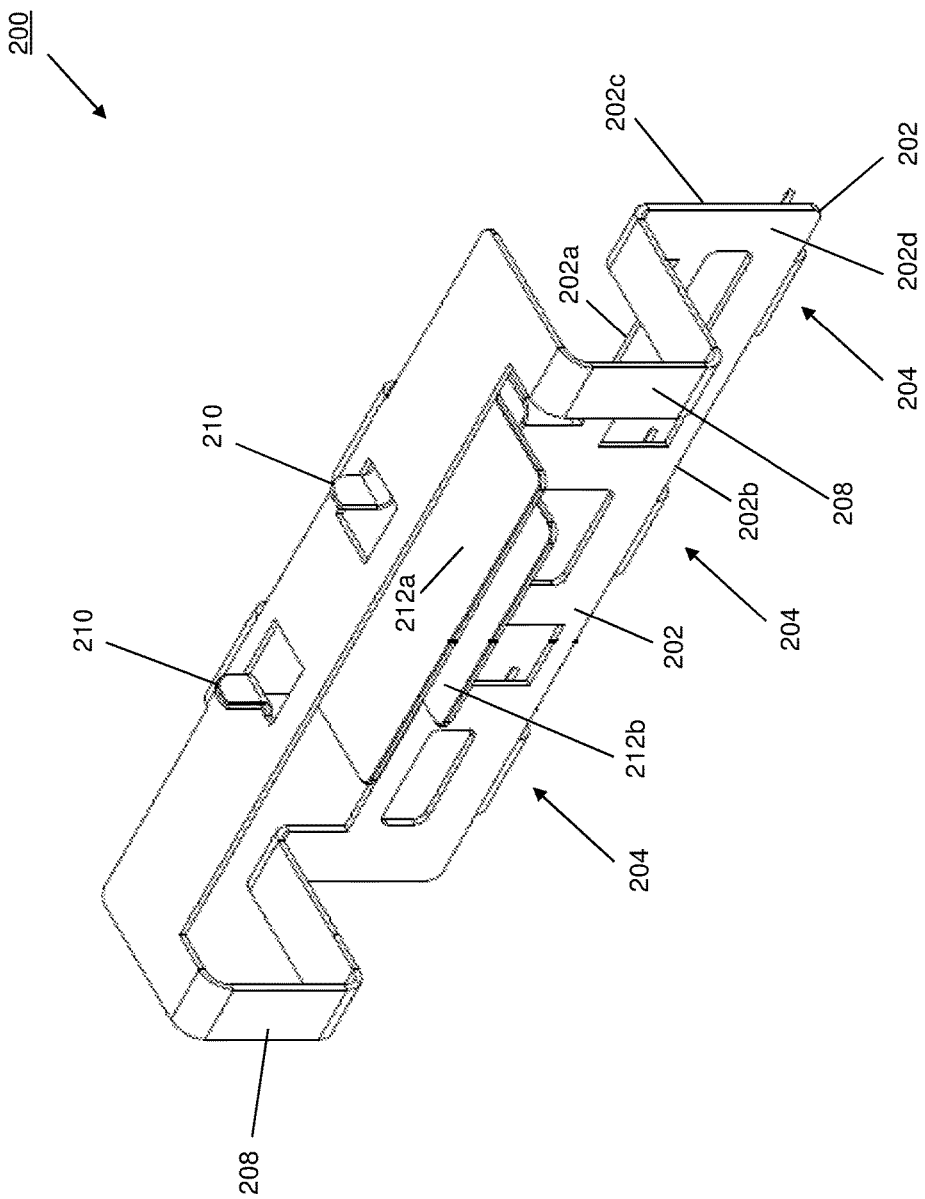
FIG. 2A is a rear perspective view illustrating an embodiment of an external mount retention device.
Figure 2B:
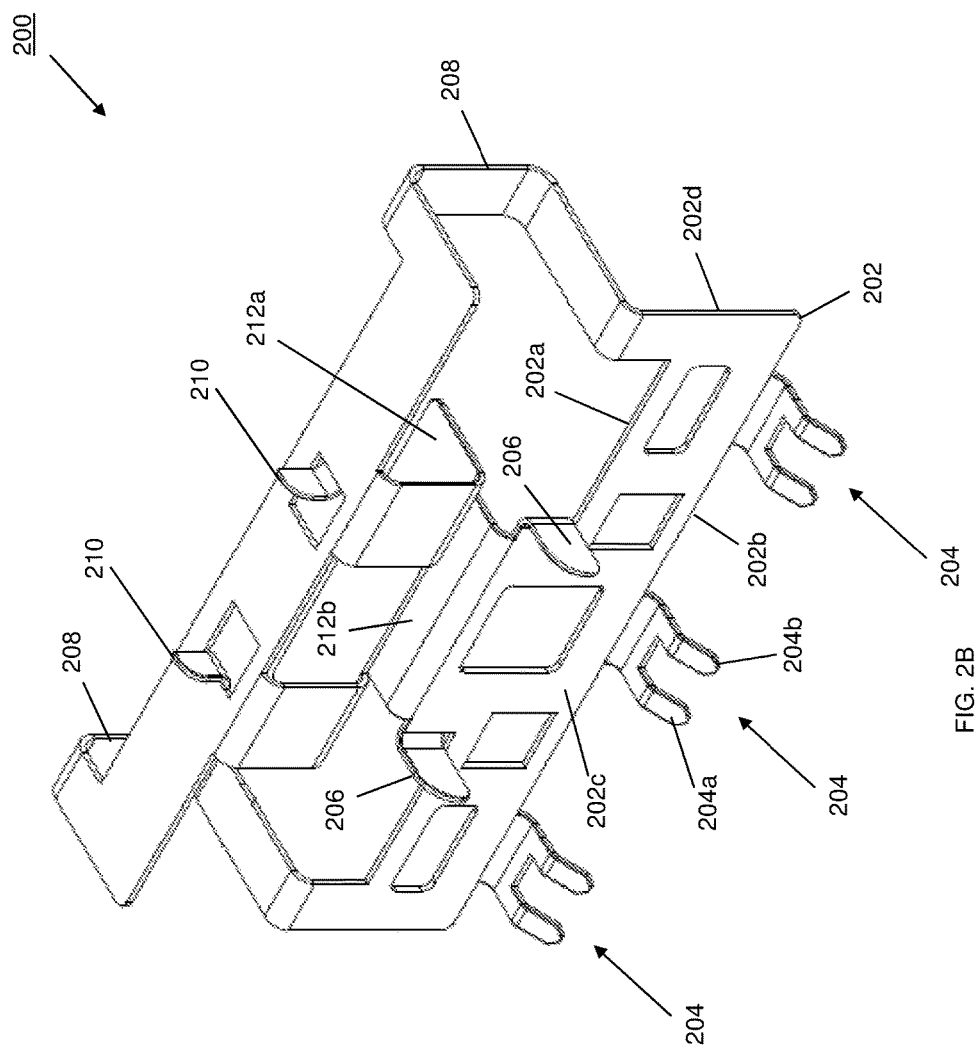
FIG. 2B is a front perspective view illustrating an embodiment of the external mount retention device of FIG. 2A.
Figure 2C:
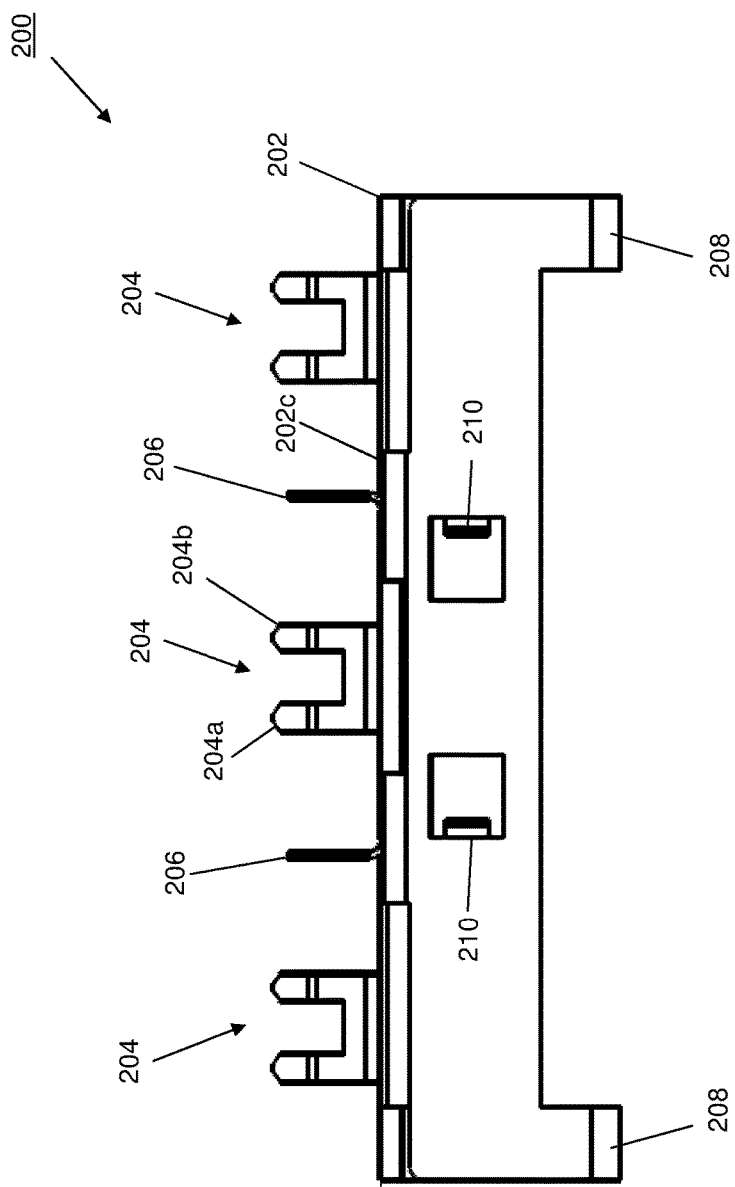
FIG. 2C is a top view illustrating an embodiment of the external mount retention device of FIG. 2A.
Figure 2D:
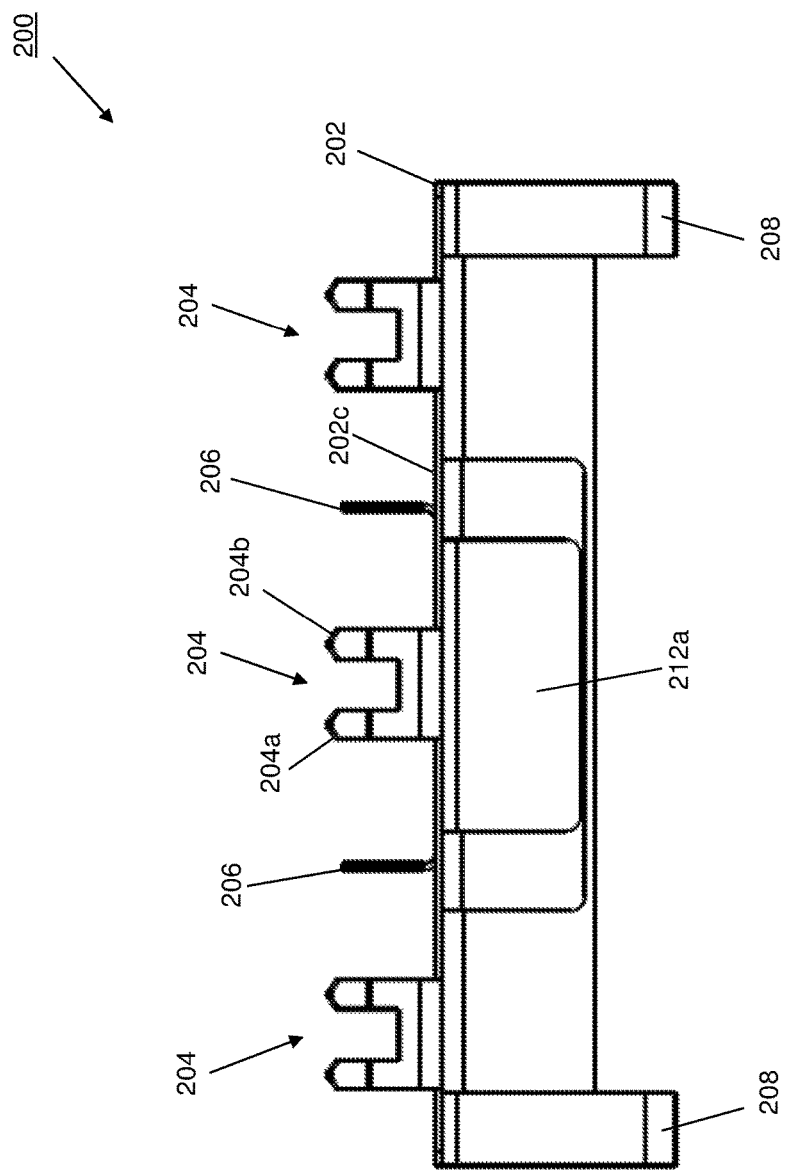
FIG. 2D is a bottom view illustrating an embodiment of the external mount retention device of FIG. 2A.
Figure 2F:
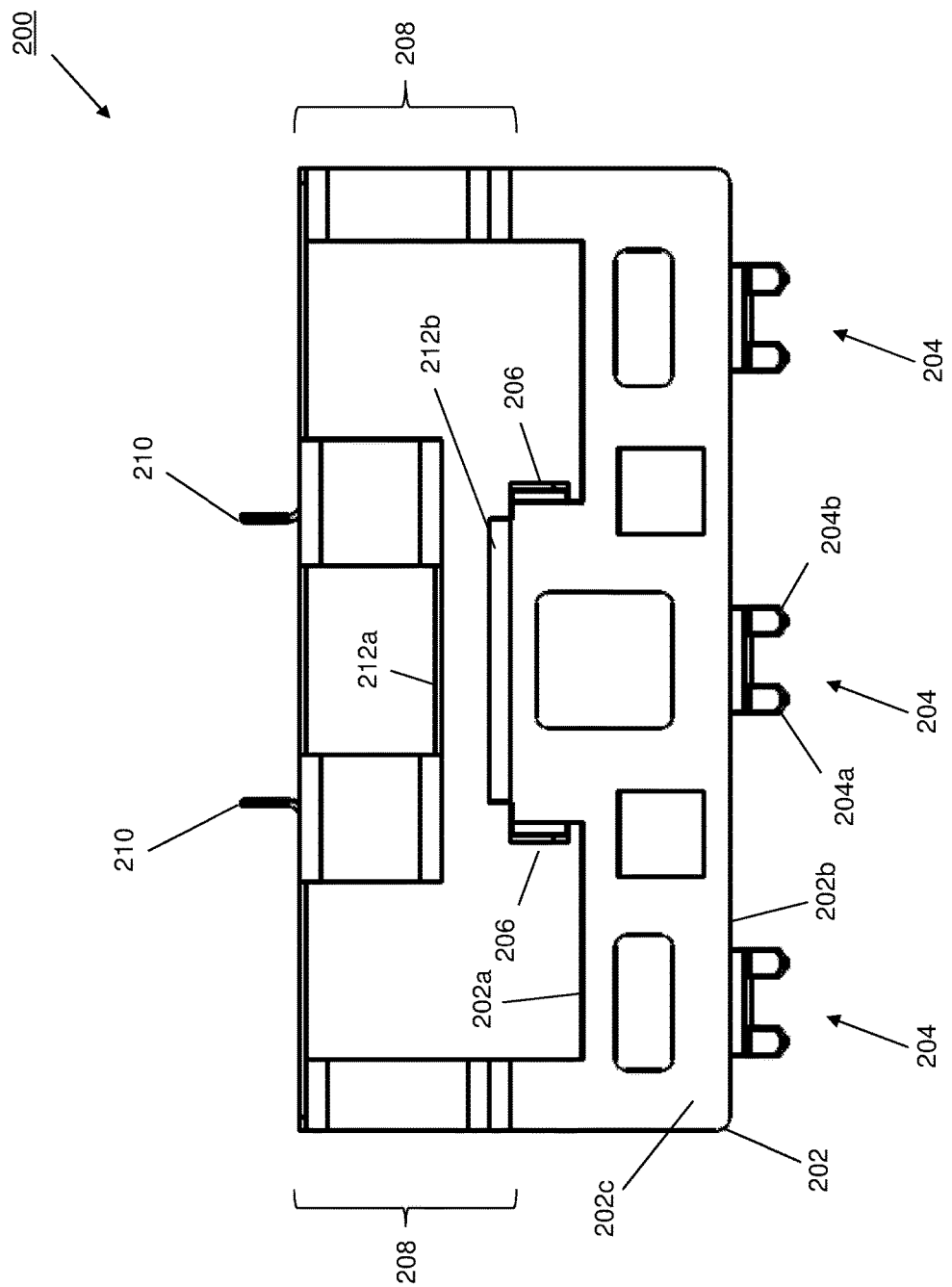
FIG. 2F is a front view illustrating an embodiment of the external mount retention device of FIG. 2A.

A first set of chassis securing members 206 extend from the base 202 at a top portion of the base that extends from the top edge 202a of the base 202 and opposite the base 202 from its bottom edge 202b. The first set of chassis securing members 206 are provided on the base 202 in a spaced apart orientation from each other, with each of the first set of chassis securing members 206 extending in a first direction A that is substantially perpendicular to the front surface 202c of the base 202. As illustrated in FIG. 2E, each of the first set of chassis securing members 206 may be provided with a beveled edge 206a to provide the chassis securing member functionality discussed below. While the example of FIGS. 2A-2F includes a plurality of chassis securing members in the first set of chassis securing members 206, each with a beveled-edge configuration, one of skill in the art will recognize that a single chassis securing member or a different number of chassis securing members, as well as different configurations of the chassis securing member(s), may be utilized depending on the application of the retention device 200 while remaining within the scope of the present disclosure.

A resilient member 208 extends from the top edge 202a of the base 202 and, in the illustrated embodiment, is provided by a portion of the retention device 202 with a substantially C-shaped cross section (as illustrated in FIG. 2E). A second set of chassis securing members 210 extend from a top portion of the resilient member 208 in a spaced apart orientation from each other, with each of the second set of chassis securing members 210 extending in a second direction B that is substantially perpendicular to the first direction A in which the first set of chassis securing members 206 extend from the top portion of the base 202. As illustrated in FIG. 2E, each of the second set of chassis securing members 210 may be provided with a beveled edge 210a to provide the chassis securing member functionality discussed below. While the example of FIGS. 2A-2F includes a plurality of chassis securing members in the second set of chassis securing members 210, each with a beveled-edge configuration, one of skill in the art will recognize that a single chassis securing member or a different number of chassis securing members, as well as different configurations of the chassis securing member(s) may be utilized depending on the application of the retention device 200 while remaining within the scope of the present disclosure. For example, in some embodiments, the first set of chassis securing members 206 and the second set of chassis securing members 210 may be replaced by a single chassis securing member that provides the retention device securing functionality discussed below.

In the illustrated embodiment, a handle is provided on the retention device 200 by a plurality of handle elements 212a and 212b, with the handle element 212a extending from the top portion of the resilient member 208 that includes the second set of chassis securing members 210, and the handle element 212b extending from the top portion of the base 202 that includes the first set of chassis securing members 206. In the specific example illustrated in FIGS. 2A-2F, the handle elements 212a and 212b extend in a third direction C that is substantially opposite the first direction A, although one of skill in the art in possession of the present disclosure will recognize that handles and/or handle elements may be provided in a variety of locations and/or configurations on the retention device 200 while remaining within the scope of the present disclosure as well. While a specific example of a retention device 200 according to the teachings of the present disclosure has been illustrated and described, one of skill in the art in possession of the present disclosure will recognize that the retention device 200 includes features specific to the application utilized for the example provided herein, and retention devices may be provided with modified features for different applications while remaining within the scope of the present disclosure as well.

Referring now to FIGS. 3A, 3B, 3C, and 3D, an embodiment of a chassis 300 is illustrated. In some embodiments, the chassis 300 may be the chassis 116 discussed above with reference to FIG. 1 and, as such, may house the components of the IHS 100. In the illustrated embodiment, the chassis 300 includes a base 302 having a top wall 302a, a bottom wall 302b that is located opposite the base 302 from the top wall 302a, a rear wall 302c that extends between the top wall 302a and the bottom wall 302b, a front wall (not visible in FIG. 3A) that is located opposite the base 302 from the rear wall 302c and that extends between the top wall 302a and the bottom wall 302b, and a pair of opposing side walls 302d and 302e that are located opposite the base 302 from each other and that each extend between the top wall 302a, the bottom wall 302b, the rear wall 302c, and the front wall. A chassis housing may be defined between the top wall 302a, the bottom wall 302b, the rear wall 302c, the front wall, and the side walls 302d and 302e.

Figure 3A:
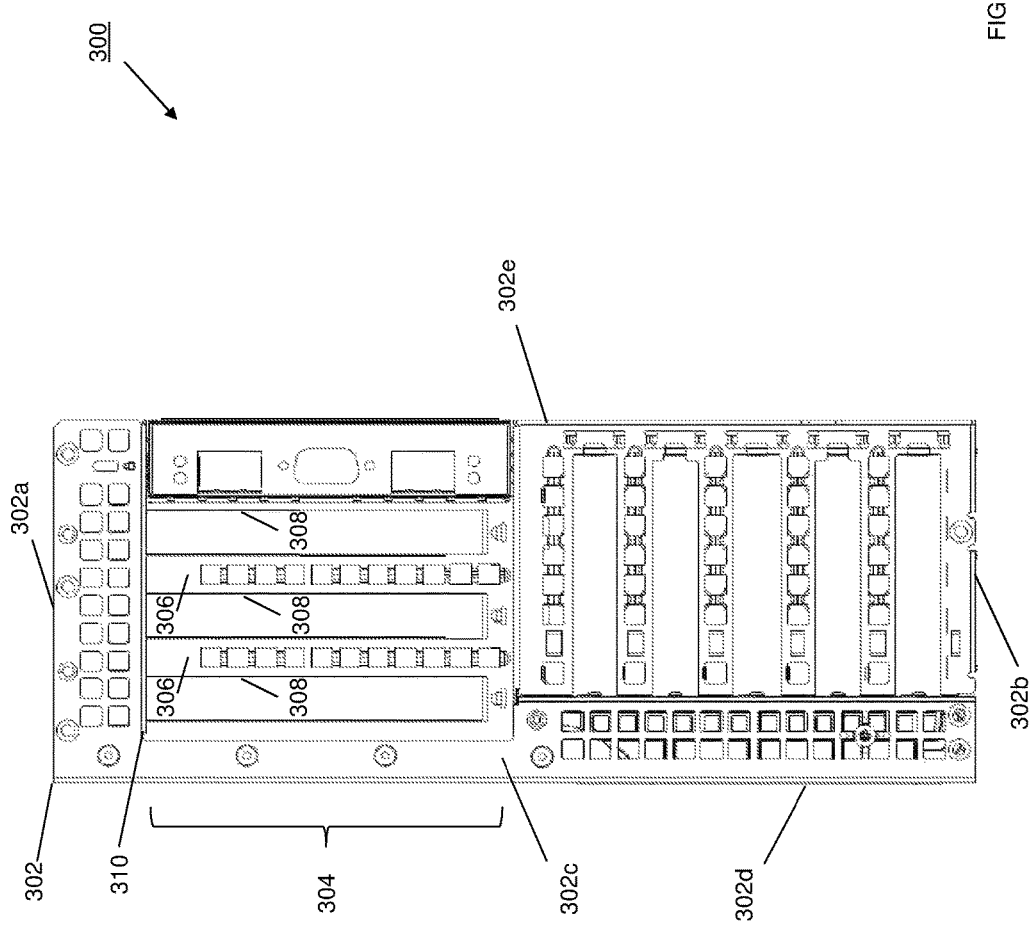
FIG. 3A is a front view illustrating an embodiment of a chassis.
Figure 3C:
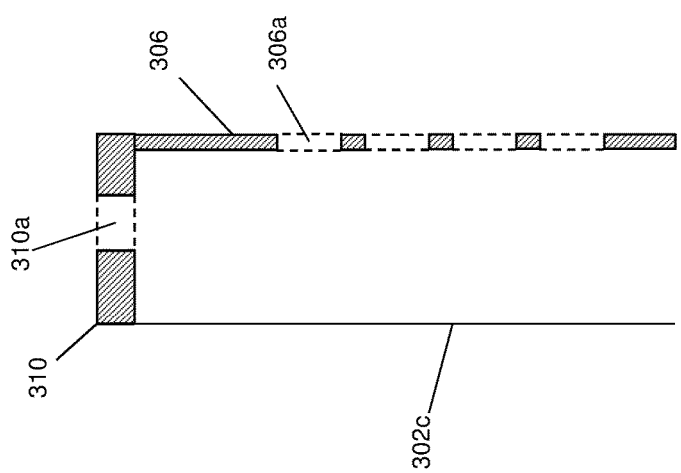
FIG. 3C is a cross sectional view illustrating an embodiment of an external mount coupling feature of FIG. 3B.

In the illustrated embodiment, rear wall 302c includes an external mount surface 304 that is located on an upper portion of the rear wall 302c adjacent the top wall 302a. The rear wall 302c includes a plurality of mount surface beams 306 and defines a plurality of engagement member chassis apertures 308 that are located on each side of the mount surface beams 306 and that extend through the rear wall 302c to the chassis housing. In the specific example in FIG. 3A, the mount surface beams 306 and engagement member chassis apertures 308 adjacent the external mount surface 304 are included in a recessed portion of the rear wall 302c having a recess overhang 310. FIGS. 3B, 3C, and 3D illustrate a portion of the external mount surface 304 for discussion below and, specifically, FIG. 3B provides a front view of one of the mount surface beams 306 and one of the engagement member chassis apertures 308, with FIG. 3C providing a cross-sectional view of that mount surface beam 306, and FIG. 3D providing a cross-sectional view of that engagement member chassis aperture 308. As can be seen in FIGS. 3B, 3C, and 3D, each mount surface beam 306 may define a securing member chassis aperture 306a that extends through the mount surface beam 306 to the chassis housing, and the recess overhang 310 may define one or more securing member chassis apertures 310a that extend through the recess overhang 310 to the chassis housing. While a specific example of a chassis 300 according to the teachings of the present disclosure has been illustrated and described, one of skill in the art in possession of the present disclosure will recognize that the chassis 300 includes features specific to the application utilized for the example provided herein, and chassis may be provided with modified features for different applications while remaining within the scope of the present disclosure as well.

Referring now to FIG. 4, an embodiment of an internal component subsystem 400 is illustrated that may include, for example, components of the IHS 100 discussed above with reference to FIG. 1. As such, the internal component subsystem 400 may be coupled to a processing system that includes the processor 102, a memory system that include the memory 114, and/or any other subsystem in the IHS 100 while remaining within the scope of the present disclosure. In the illustrated embodiment, an internal component sub-chassis 402 is provided that may include a cage or other support structure that would be apparent to one of skill in the art in possession of the present disclosure. A board 404 is mounted to the internal component sub-chassis 402, and includes a plurality of connectors 406 that are mounted to the board 404 in a spaced apart orientation from each other. Each of a plurality of internal components 408 is connected to a respective one of the connectors 406. For example, the internal components 408 may be Peripheral Component Interconnect (PCI) cards, and may each include a card edge and/or other card connector that is configured to engage their respective connector 406 to electrically couple the PCI card to the board 404, which may be a "daughter" card that is further coupled to a mother board that includes a processing system, memory system, and/or other IHS components of the IHS 100. Each of the internal components 408 defines a plurality of engagement member internal component apertures 408a and 408b that extend into the internal component 408.

While a specific example of a multi-internal component configuration is illustrated and described herein, one of skill in the art in possession of the present disclosure will recognize that a single internal component (e.g., a single PCI card that couples to a circuit board mounted within the chassis rather than to the board 404 on the internal component sub-chassis 402 in FIG. 4) may be utilized with a retention device according to the teachings of the present disclosure while falling within its scope as well. As such, while specific features for internal component subsystem 400 are provided in order to support multiple internal components, a wide variety of modification to enable a single internal component, or a different number of internal components and/or internal component configurations, to be retained according to the teachings of the present disclosure will fall within its scope as well.

Referring now to FIG. 5, an embodiment of a method 500 for retaining internal components in a chassis is illustrated. As discussed below, the systems and methods of the present disclosure provide for the retention of internal components that are housed in a chassis housing using a retention device that positioned opposite the chassis from the chassis housing and adjacent an external surface of the chassis. The retention device includes internal component engagement member(s) that extend through engagement member chassis aperture(s) defined by the chassis to engage the internal component(s), as well as chassis securing member(s) that engage the chassis to resist movement of the retention device relative to the chassis, a configuration which operates to resist movement of the internal component(s) relative to the chassis. As such, internal components such as a PCI card connected to a connector that is housed in the chassis may be retained in that connector to prevent their disconnection, while not using up substantial space within the chassis housing to provide the retention functionality.

Figure 6:
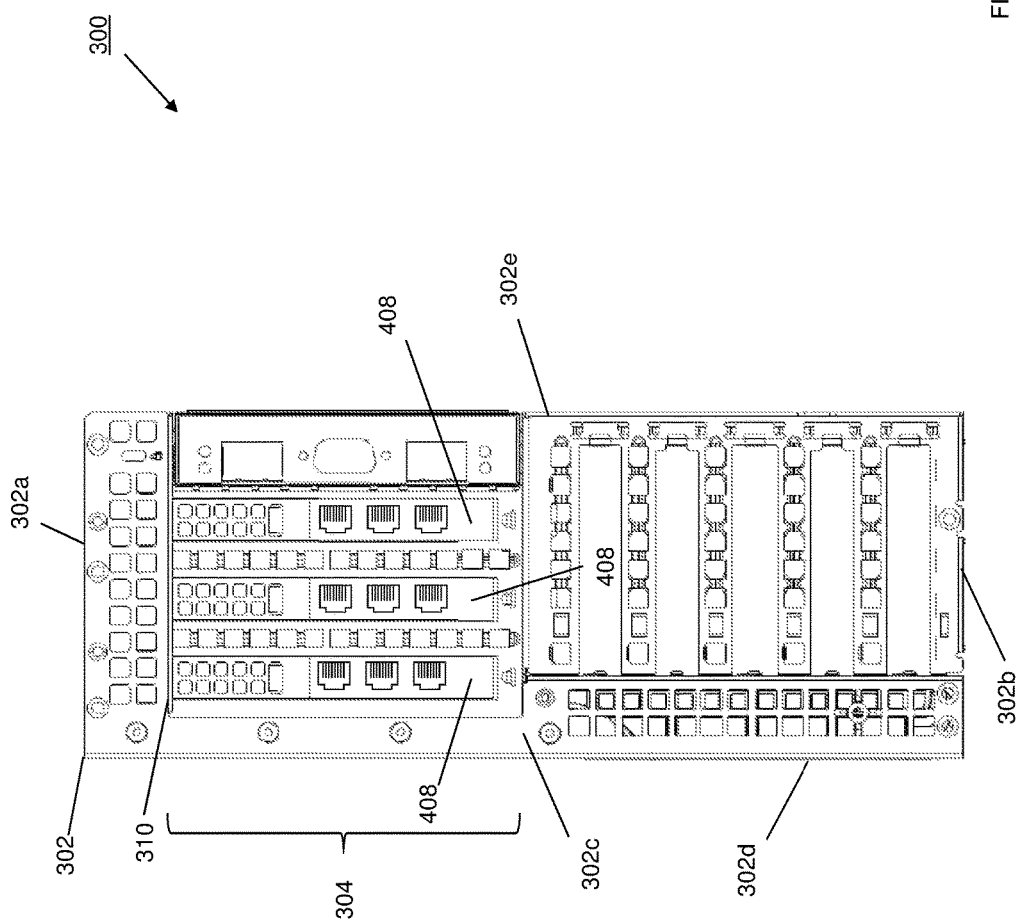
FIG. 6 is a front view illustrating an embodiment of the internal components of FIG. 4 provided in the chassis of FIGS. 3A-3D.

The method 500 begins at block 502 where internal component(s) are provided in a chassis. In an embodiment, at block 502, the internal component subsystem 400 of FIG. 4 may be provided in the chassis 300 of FIG. 3. For example, the internal component sub-chassis 402 may be positioned in the chassis housing defined by the chassis 300 and adjacent the external mounting surface 304. In some embodiments, the internal component sub-chassis 402 may be mounted to the chassis 300, while the board 404 and/or the internal components 408 may be coupled to other components or subsystems that are located in the chassis housing as well. As can be seen in FIG. 6, with the internal component sub-chassis 402 positioned in the chassis housing adjacent the external mounting surface 304, a respective one of the internal components 408 is located adjacent respective ones of the engagement member chassis apertures 308 such that the engagement member internal component apertures 408a and 408b defined by the internal components 408 are accessible through their adjacent engagement member chassis apertures 308.

The method 500 then proceeds to block 504 where internal component engagement member(s) on a retention device are extended through engagement member chassis aperture(s) on the chassis to engage the internal component(s). In an embodiment, at block 504, the retention device 200 of FIGS. 2A-2F is positioned adjacent the external mount surface 304 on the chassis 300 (e.g., via a user holding the handle elements 212a and 212b) such that the internal component engagement members 204 is located adjacent respective engagement member chassis apertures 308. The retention device 200 may then be moved towards the chassis 300 such that the internal component engagement members 204 move through their respective engagement member chassis apertures 308, which allows the legs 204a and 204b on each internal component engagement members 204 to move through respective engagement member internal component apertures 408a and 408b to position the retention device 200 in a coupling orientation D, as illustrated in FIG. 7A.

Figure 7B:
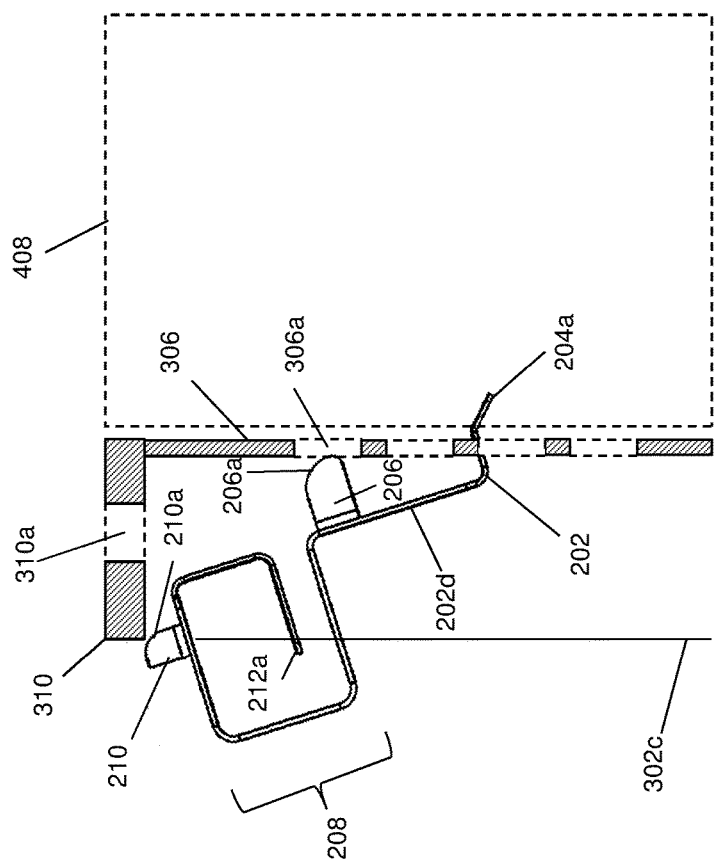
FIG. 7B is a partial cross sectional view illustrating an embodiment of the external mount retention device of FIGS. 2A-2F being coupled to the chassis and internal components of FIG. 6.
Figure 7C:
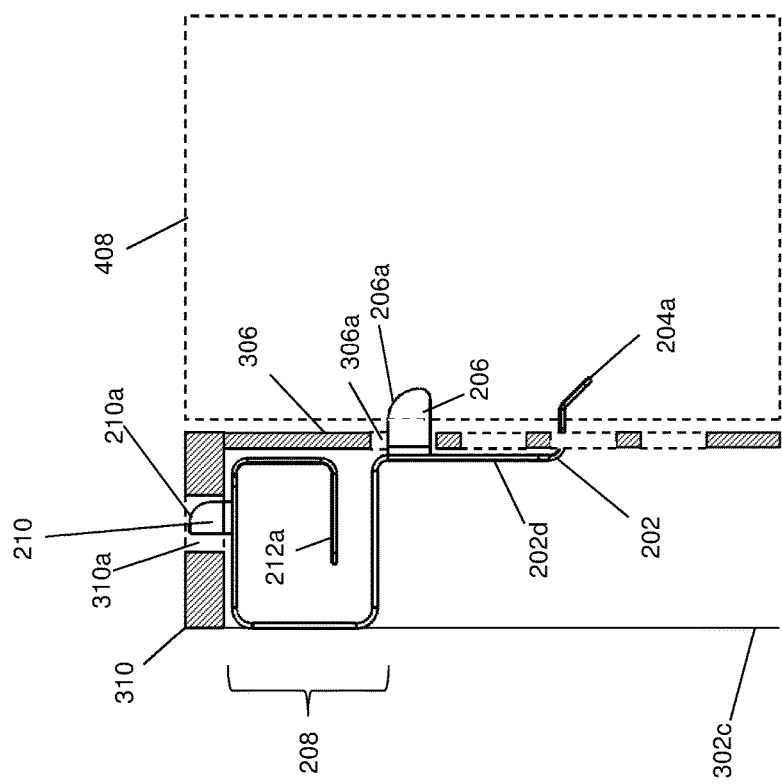
FIG. 7C is a partial cross sectional view illustrating an embodiment of the external mount retention device of FIGS. 2A-2F coupled to the chassis and internal components of FIG. 6.

The method 500 then proceeds to block 506 where chassis securing member(s) on the retention device are engaged with the chassis to resist movement of the retention device and the internal component(s) relative to the chassis. In an embodiment, at block 506, the retention device 200 may be rotated from the coupling orientation D in a direction E and about the engagement of the legs 204a and 204b on each internal component engagement members 204 with the respective engagement member internal component apertures 408a and 408b on the internal components 408. With reference to FIGS. 7B and 7C, the rotation in the direction E causes the beveled edge 210a on the second set of chassis securing members 210 to engage the recess overhang 310, and the resilient member 208 is configured to deform to allow the second set of chassis securing members 210 to move relative to the internal component engagement members 204 so that the second set of chassis securing members 210 may become positioned in the secure member chassis aperture(s) 310a defined by the recess overhang 310. In addition, the rotation in the direction E may also cause the beveled edge 206a on the first set of chassis securing members 206 to engage the mount surface beams 306 to allow the first set of chassis securing members 206 to become positioned in respective securing member chassis apertures 306a defined by the mount securing beams 306.

Figure 7D:
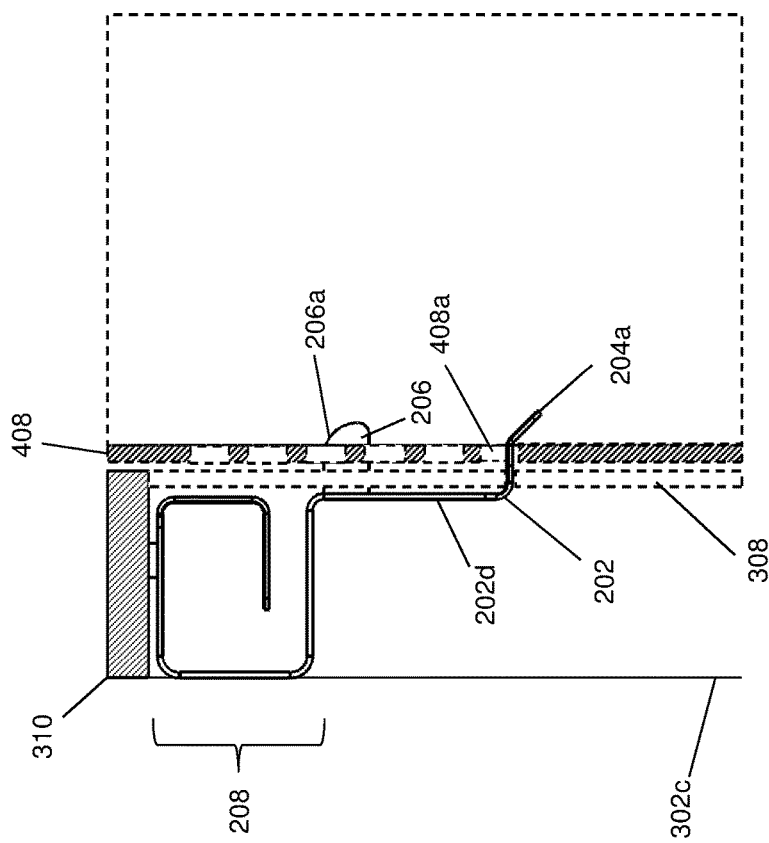
FIG. 7D is a partial cross sectional view illustrating an embodiment of the external mount retention device of FIGS. 2A-2F coupled to the chassis and internal components of FIG. 6.
Figure 7E:
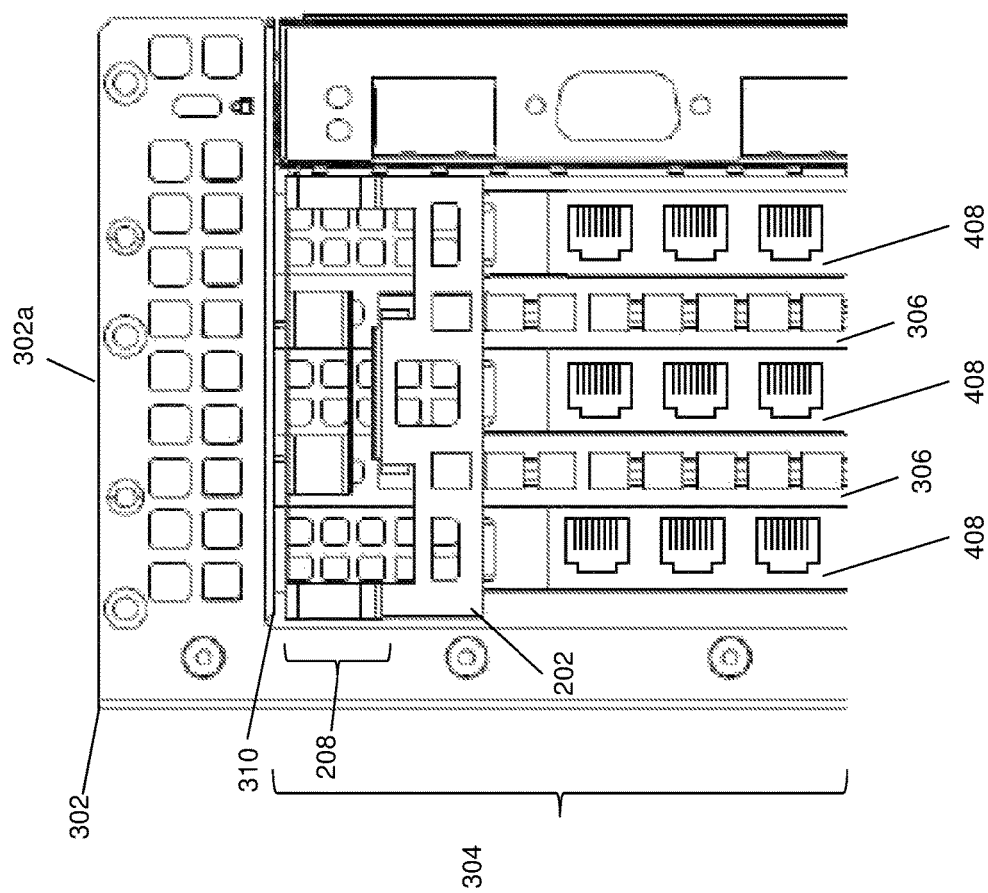
FIG. 7E is a front view illustrating an embodiment of the external mount retention device of FIGS. 2A-2F coupled to the chassis and internal components of FIG. 6.

As illustrated in FIGS. 7C, 7D, and 7E, with the first set of chassis securing members 206 and the second set of chassis securing members 210 engaging the chassis 300 (e.g., extending through the securing member chassis apertures 306a and 310a, respectively, in the illustrated embodiment), the movement of the retention device 200 relative to the chassis 300 is resisted, and the engagement of the internal component engagement members 204 with the internal components 408 (e.g., extending through the engagement member chassis apertures 308, with the legs 204a and 204b extending through the engagement member internal component apertures 408a and 408b, respectively, in the illustrated embodiment), the movement of the internal components 408 relative to the chassis 300 is resisted. As such, with the internal component sub-chassis 402 mounted to the chassis 300, the board 404 mounted to the internal component sub-chassis 402, and the connectors 404 mounted to the board 404, the movement of the internal components 408 relative to the connectors 404 is resisted to resist their disconnection.

As would be understood by one of skill in the art in possession of the present disclosure, the retention device 200 may be disengaged from the internal components 408 and the chassis 300 by grasping the handle elements 212a and 212b, providing a force on the handle elements 212a and 212b to deform the resilient member 208 such that the second set of chassis securing members 210 are not located in the chassis securing member aperture(s) 310a, and then rotating the retention device 200 opposite the direction E until the legs 204a and 204b on each internal component engagement members 204 may be removed from the respective engagement member internal component apertures 408a and 408b and the internal component engagement members 204 may be removed from their respective engagement member chassis apertures 308.

Thus, systems and methods have been described that provide for the retention of internal components that are housed in a chassis housing using a retention device that is positioned adjacent an external surface of the chassis that is opposite the chassis from the chassis housing. The retention device includes internal component engagement member(s) that extend through engagement member chassis aperture(s) defined by the chassis to engage the internal component(s), as well as chassis securing member(s) that engage the chassis to resist movement of the retention device relative to the chassis, which operates to resist movement of the internal component(s) relative to the chassis. As such, internal components such as a PCI card connected to a connector that is housed in the chassis may be retained in that connector to prevent their disconnection, while not using up any substantial space within the chassis housing.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An externally mounted internal component retention device, comprising:
   a base;
   a first chassis securing member extending from the base, wherein the first chassis securing member is configured to engage a chassis to resist movement of the base relative to the chassis when the base is positioned immediately adjacent an external mount surface on the chassis; and
   a first internal component engagement member extending from the base, wherein the first internal component engagement member is configured to extend through an engagement member chassis aperture defined by the chassis and engage an internal component that is housed in the chassis to resist movement of the internal component relative to the chassis when the base is positioned immediately adjacent the external mount surface on the chassis.

2. The device of claim 1, further comprising:
a handle that extends from a first side of the base, wherein the first internal component engagement member extends from a second side of the base that is opposite the base from the first side.

3. The device of claim 1, wherein the first chassis securing member extends from the base in a first direction and is configured to engage a first securing member chassis aperture defined by the chassis, and wherein the device further comprises:
a second chassis securing member that extends from the base in a second direction that is substantially perpendicular to the first direction, wherein the second chassis securing member is configured to engage a second securing member chassis aperture that is defined by the chassis.

4. The device of claim 1, further comprising:
at least one second internal component engagement member extending from the base, wherein each of the first internal component engagement member and the at least one second internal component engagement member are configured to extend through a respective engagement member chassis aperture defined by the chassis to engage a respective internal component housed in the chassis to resist movement of that internal component relative to the chassis when the base is positioned immediately adjacent the external mount surface on the chassis.

5. The device of claim 1, wherein the first internal component engagement member is configured to extend through the engagement member chassis aperture defined by the chassis, and extend through an engagement member internal component aperture defined by the internal component housed in the chassis in order to engage the internal component.

6. The device of claim 1, further comprising:
a resilient member located on the base between the first chassis securing member and the first internal component engagement member, wherein the resilient member is configured to allow the first chassis securing member to move relative to the first internal component engagement member in order to allow the first chassis securing member to become positioned in a securing member chassis aperture defined by the chassis when the first internal component engagement member is engaging the internal component.

7. The device of claim 1, wherein the internal component is a card coupled to a connector that is housed in the chassis, and wherein the first internal component engagement member resisting movement of the internal component relative to the chassis operates to resist disengagement of the card from the connector.

8. An Information Handling System (IHS), comprising:
a chassis defining a chassis housing and an engagement member chassis aperture that extends through the chassis to the chassis housing, wherein the chassis includes an external mount surface that is located opposite the chassis from the chassis housing;
an internal component located in the chassis housing adjacent the engagement member chassis aperture; and
a retention device located immediately adjacent the external mount surface of the chassis, wherein the retention device includes:
a first chassis securing member that engages the chassis to resist movement of the retention device relative to the chassis; and
a first internal component engagement member extending through the engagement member chassis aperture and engaging the internal component to resist movement of the internal component relative to the chassis.

9. The IHS of claim 8, wherein the retention device includes: a handle that extends from a first side of the retention device, wherein the first internal component engagement member extends from a second side of the retention device that is opposite the retention device from the first side.

10. The IHS of claim 8, wherein the chassis defines a first securing member chassis aperture and a second securing member aperture, and wherein the first chassis securing member extends from the retention device in a first direction to engage the first securing member chassis aperture, and wherein the retention device further comprises: a second chassis securing member that extends from the retention device in a second direction that is substantially perpendicular to the first direction to engage the second securing member chassis aperture.

11. The IHS of claim 8, wherein the chassis defines a plurality of engagement member chassis apertures, and wherein the IHS further comprises: a plurality of internal components located in the chassis housing, wherein the retention device includes: at least one second internal component engagement member extending from the retention device, wherein each of the first internal component engagement member and the at least one second internal component engagement member extend through respective engagement member chassis apertures to engage respective internal components to resist movement of those internal component relative to the chassis.

12. The IHS of claim 8, wherein the internal component defines an engagement member internal component aperture, and wherein the first internal component engagement member extends through the engagement member chassis aperture and the engagement member internal component aperture in order to engage the internal component.

13. The IHS of claim 8, wherein the chassis defines a securing member chassis aperture, and wherein the retention device includes: a resilient member located between the first chassis securing member and the first internal component engagement member, wherein the resilient member is configured to allow the first chassis securing member to move relative to the first internal component engagement member in order to allow the first chassis securing member to become positioned in the securing member chassis aperture when the first internal component engagement member is engaging the internal component.

14. A method for securing an internal component in a chassis, comprising:
providing an internal component in a chassis housing defined by a chassis such that the internal component is located adjacent an engagement member chassis aperture that is defined by the chassis and extends through the chassis to the chassis housing; and
positioning a retention device immediately adjacent an external mount surface on the chassis that is located adjacent the engagement member aperture, wherein the positioning of the retention device causes:

a first chassis securing member on the retention device to engage the chassis to resist movement of the retention device relative to the chassis; and a first internal component engagement member on the retention device to extend through the engagement member chassis aperture to engage the internal component and resist movement of the internal component relative to the chassis.

15. The method of claim 14, wherein the positioning the retention device is performed using a handle that extends from a first side of the retention device, wherein the first internal component engagement member extends from a second side of the retention device that is opposite the retention device from the first side.

16. The method of claim 14, wherein the chassis defines a first securing member chassis aperture and a second securing member aperture, and wherein the first chassis securing member extends from the retention device in a first direction and into the first securing member chassis aperture to engage the chassis, and wherein the positioning of the retention device causes:

a second chassis securing member that extends from the retention device in a second direction that is substantially perpendicular to the first direction to extend into the second securing member chassis aperture to engage the chassis.

17. The method of claim 14, wherein the chassis defines a plurality of engagement member chassis apertures, and wherein a plurality of internal components are located in the chassis housing, wherein the positioning of the retention device causes:

the first internal component engagement member and at least one second internal component engagement member on the retention device to extend through respective engagement member chassis apertures to engage respective internal components to resist movement of those internal component relative to the chassis.

18. The method of claim 14, wherein the internal component defines an engagement member internal component aperture, and wherein the positioning of the retention device causes:

the first internal component engagement member to extend through the engagement member chassis aperture and the engagement member internal component aperture in order to engage the internal component.

19. The method of claim 14, wherein the chassis defines a securing member chassis aperture, and wherein the positioning of the retention device causes:

a resilient member located between the first chassis securing member and the first internal component engagement member to allow the first chassis securing member to move relative to the first internal component engagement member in order to allow the first chassis securing member to become positioned in the securing member chassis aperture when the first internal component engagement member is engaging the internal component.

20. The method of claim 14, wherein the internal component is a card coupled to a connector that is housed in the chassis, and wherein the first internal component engagement member resisting movement of the internal component relative to the chassis operates to resist disengagement of the card from the connector.

* * * * *